United States Patent

Onishi et al.

[11] Patent Number: 5,743,007
[45] Date of Patent: Apr. 28, 1998

[54] METHOD OF MOUNTING ELECTRONICS COMPONENT

[75] Inventors: Hiroaki Onishi, Higashiosaka; Haruto Nagata, Sakai; Masato Hirano, Osaka; Kenichiro Suetsugu, Nishinomiya, all of Japan

[73] Assignee: Matsushita Electric Industrial Co., Ltd., Kadoma, Japan

[21] Appl. No.: 587,461

[22] Filed: Jan. 17, 1996

[30] Foreign Application Priority Data

Jan. 17, 1995 [JP] Japan ................... 7-004785

[51] Int. Cl.⁶ .................................... H05K 3/34
[52] U.S. Cl. ................... 29/840; 29/827; 228/180.21
[58] Field of Search ............... 29/840, 827; 228/180.21

[56] References Cited

U.S. PATENT DOCUMENTS

| | | | |
|---|---|---|---|
| 4,998,342 | 3/1991 | Bonnell et al. | 29/840 |
| 5,320,272 | 6/1994 | Melton et al. | 228/180.21 |
| 5,593,080 | 1/1997 | Teshima et al. | 29/840 |

FOREIGN PATENT DOCUMENTS

| | | | |
|---|---|---|---|
| 153 951 | 2/1982 | Germany | 228/180.21 |
| 61-121779 | 7/1986 | Japan . | |
| 61-134080 | 8/1986 | Japan . | |
| 62-12982 | 1/1987 | Japan . | |
| 3030 492 | 2/1991 | Japan | 29/840 |
| 3-196 692 | 8/1991 | Japan | 29/840 |
| 4-154 191 | 5/1992 | Japan | 29/840 |
| 5-29797 | 2/1993 | Japan . | |
| 5-211 389 | 8/1993 | Japan | 29/840 |

*Primary Examiner*—Carl J. Arbes
*Attorney, Agent, or Firm*—Wenderoth, Lind & Ponack

[57] ABSTRACT

A method for mounting on integrated circuit having many leads with narrow pitches on the printed circuit board. In a method, a resist layer is formed between lands on the board, and solder paste is applied with a stencil to the lands so that the positions of the solder paste on the lands are staggered. Then, leads of the integrated circuit are positioned on the lands. Then, reflow soldering of the leads to the lands is performed with the solder paste in a nitrogen environment. In a different embodiment, each land includes a first portion and a second portion having a width narrower than the first portion, and the second portions are arranged staggeredly among the lands. Then, solder paste is applied to the first portions having the wider width. Then, reflow soldering of the leads to the lands is performed with the solder paste in a nitrogen environment. If solder including bismuth is used, reflow soldering can be performed in ambient environment.

14 Claims, 3 Drawing Sheets

Fig. 4
Fig. 5
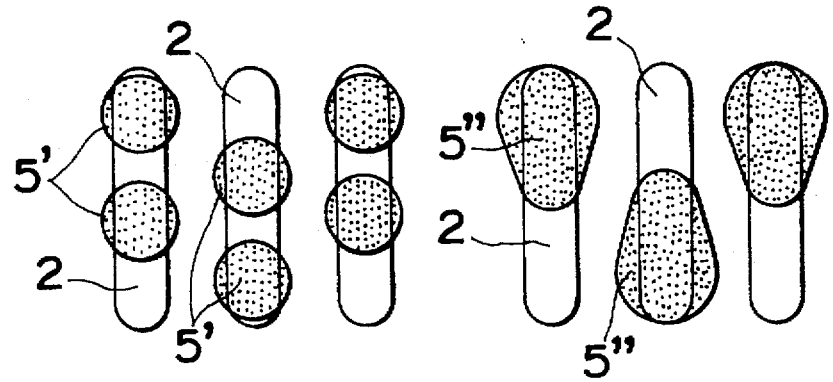
Fig. 6
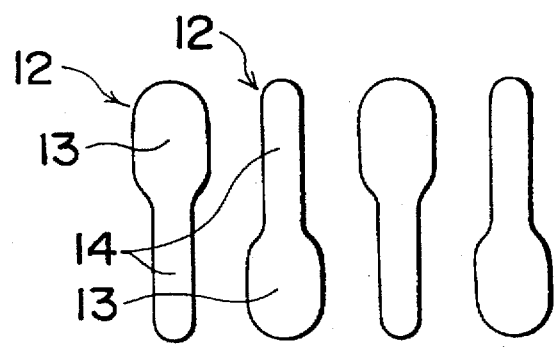
Fig. 7A
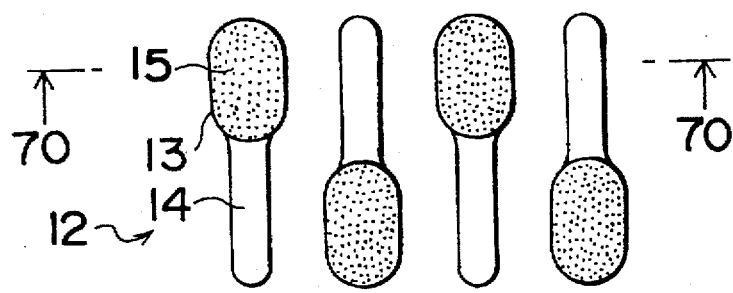
Fig. 7B
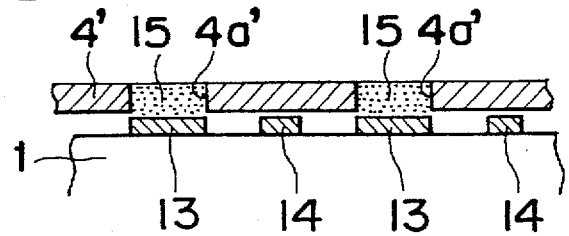

METHOD OF MOUNTING ELECTRONICS COMPONENT

BACKGROUND OF THE INVENTION

1. Field of the Invention

The present invention relates to a method of mounting an electronics component having many outer leads with narrow pitches to a plate such as a printed circuit board.

2. Description of the Prior Art

In an electronic device or apparatus, an electronics component such as an integrated circuit having many outer leads with narrow pitches is mounted with soldering to a printed circuit board or the like for forming an electric circuit. A printed circuit board has lands or electrodes in correspondence to the leads, and the leads are connected with soldering to the lands. When the integrated circuit is mounted to the printed circuit board, solder paste is applied first to the lands. Next, the leads thereof are put on the lands, and the solder paste is subjected to reflow soldering to adhere the leads to the lands.

Recently, the number of leads of an integrated circuit has increased, and some of the leads have a pitch thereof as narrow as 0.3 mm or less. Therefore, lands in the printed circuit board also have similar narrow pitches. Then, adhesion of such an integrated circuit to a printed circuit board with soldering is liable to become incomplete.

For example, a stencil is used to print solder paste onto the lands, and a thickness of the stencil becomes 0.13–0.15 mm and a width of openings in the stencil for filling solder paste becomes about 0.15 mm. Then, when the stencil is removed after the solder is filled in the openings, a part of the solder which has been applied to the land may be removed. Thus, the solder amount for each land may become deficient, and the adhesion becomes incomplete, or a fillet may not be formed or adhesion strength becomes weak.

Different types of printed circuit boards are proposed in Japanese Utility Model laid open Publications 121779/1986 and 134080/1986. The printed circuit boards have two types of lands for soldering leads of an integrated circuit. The lands are provided staggeredly, so that soldering positions are separated from each other. It is further proposed to have leads having different length alternately.

On the other hand, Japanese Utility Model laid open Publication 12982/1987 and Japanese Patent laid open Publication 29797/1993 describe a printed circuit board with lands of the same size for an integrated circuit, but solder paste is applied at staggered positions on the lands. In the latter, solder paste applied to a land has a circular shape and it has a radius larger than the width of a land.

However, in this method, solder may spread besides a land because a radius thereof is larger than the width of a land, and a solder may be extended to an adjacent land to form a bridged solder or to connect adjacent leads erroneously. Then, it is desirable that adjacent leads are not connected erroneously with the solder while it is also needed that solder paste is supplied sufficiently for soldering.

SUMMARY OF THE INVENTION

An object of the present invention is to provide a method of securely mounting an electronics component having narrow pitch leads to a board.

In one aspect of the invention, after a solder resist layer is formed between lands in a board with a stencil, solder paste is applied on a portion of each land so that the position of the portion on the land is staggered. Then, an electronics component is put on the board so that leads thereof are put on the lands. Next, the leads are adhered to the lands with reflow soldering in a nitrogen environment with the solder paste. When solder paste comprising bismuth is used, reflow soldering can be performed in ambient environment.

In another aspect of the invention, a board having lands for mounting leads of an electronics component is provided so that each of the lands comprises a first portion and a second portion having a width narrower than that of the first one, the first portions being arranged staggeredly. Solder paste is applied on the first portions of the lands, and an electronics component is put on the board so that leads thereof are put on the lands. Then, the leads are adhered to the lands with reflow soldering in a nitrogen environment with the solder paste. When solder paste comprising bismuth is used, reflow soldering can be performed in ambient environment.

An advantage of the present invention is that an electronics component is adhered surely to the lands without connecting adjacent lands erroneously.

BRIEF DESCRIPTION OF THE DRAWINGS

These and other objects and features of the present invention will become clear from the following description taken in conjunction with the preferred embodiments thereof with reference to the accompanying drawings, and in which:

FIG. 4 is a plan view for illustrating application of solder paste to lands;

FIG. 5 is another plan view for illustrating application of solder paste to lands;

FIG. 6 is a plan view of lands in a different embodiment; and

FIG. 7A is a plan view of lands with solder paste applied staggeredly, and FIG. 7B is a sectional view along line 70—70 in FIG. 7A in a step of mounting an electronics component on a printed circuit board.

DETAILED DESCRIPTION OF THE PREFERRED EMBODIMENTS

Figure 1A:
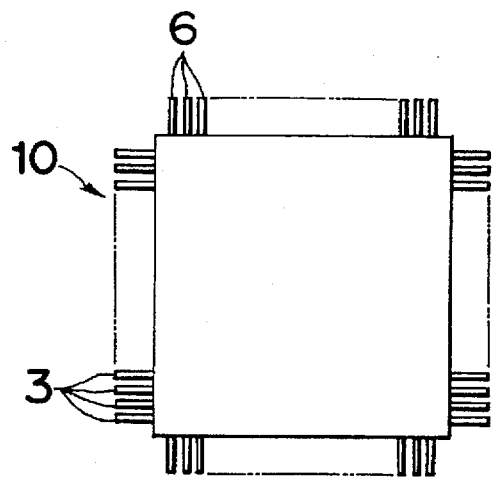
FIG. 1A is a plan view of an integrated circuit having many lead with narrow pitches.
Figure 1B:
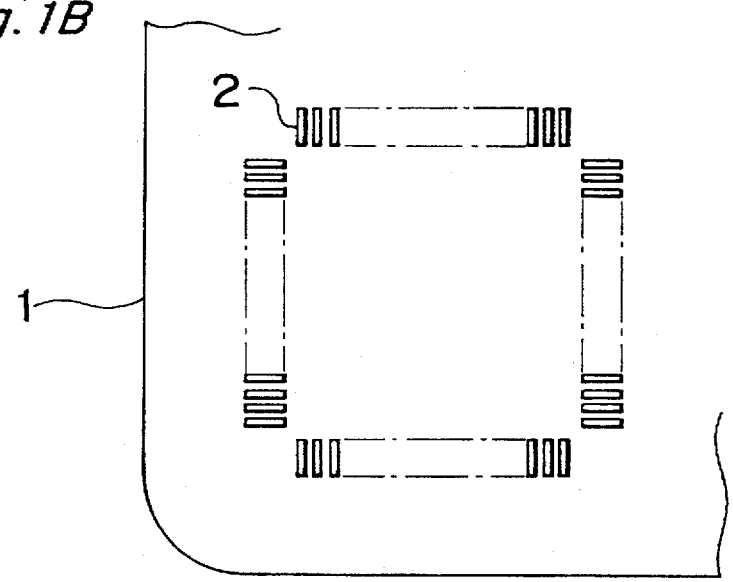
FIG. 1B is a partial plan view of a printed circuit board with lands.
Figure 1C:
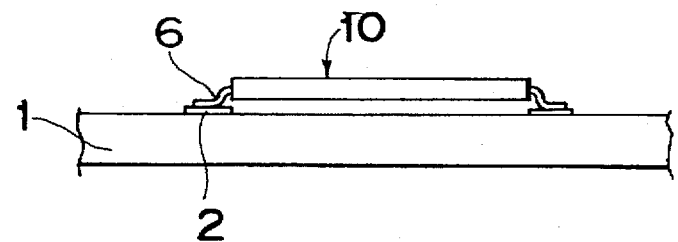
FIG. 1C is a sectional view of an integrated circuit mounted on a printed circuit board.

Referring now to the drawings, wherein like reference characters designate like or corresponding parts throughout the several views, FIG. 1A shows an integrated circuit 10 having many leads 6 with narrow pitches between them along four sides of the component 10. As shown in FIG. 1B, a printed circuit board 1 has lands 2 in correspondence to the leads 6. As shown in FIG. 1C, the leads 6 are connected with reflow soldering to the lands 2 to mount the integrated circuit 10 on the printed circuit board 1. When the integrated circuit 10 is adhered to the printed circuit board 1, solder paste is printed first on the lands 2 with a stencil. Next, the leads 6 of the integrated circuit 10 are put on the lands 2, and the solder paste is melted to adhere the leads 6 to the lands 2.

Figure 2:
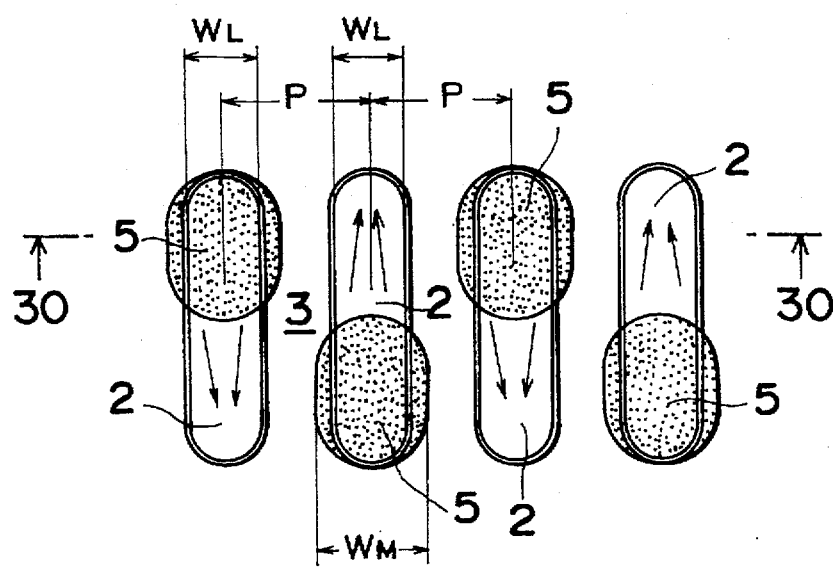
FIG. 2 is a plan view of lands with solder paste applied alternately among the lands.

FIG. 2 shows lands 2 provided in a printed circuit board 1 for mounting the integrated circuit 10, and the lands 2 have a narrow pitch P of about 0.3 mm. For simplicity of explanation, only four lands 2 are shown in FIG. 2 for leads along one side of an integrated circuit shown in FIG. 1B. The lands 2 have the same elongated size and are arranged in parallel to each other. In the example shown in FIG. 2, the lands 2 have rounded edges at two ends thereof.

Figure 3A:
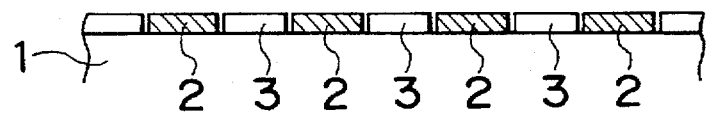
FIG. 3A is a sectional view of a printed circuit board with a solder resist layer.

Next, a method of mounting the electronics component 10 on the printed circuit board 1 is explained with reference to FIGS. 3A–3C of sectional views along line 30—30 in FIG. 2. First, as shown in FIG. 3A, a solder resist layer 3 is formed around each of the lands 2. The solder resist layer 3 is provided to prevent spreading the solder paste between the lands 2.

Figure 3B:
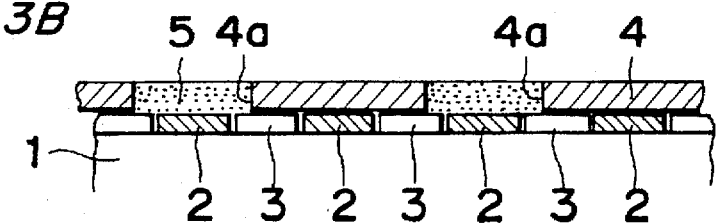
FIG. 3B is a sectional view along line 30—30 in FIG. 2.
Figure 3C:
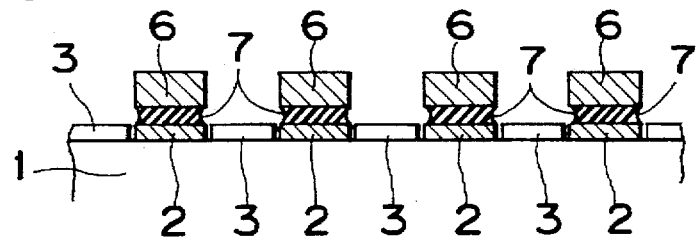
FIG. 3C is a sectional view in a step of mounting an electronics component on a printed circuit board.

Then, as shown in FIG. 3B, a stencil 4 for printing solder paste is put on the board 1 so that its openings 4a are located over the lands 2. The openings 4a are arranged staggeredly, or they are arranged at alternate positions or at upper portions and lower ones of the lands alternately. As shown in FIG. 2, the solder paste 5 is applied to a portion of each pad or an upper or lower half of each pad 2, and the portion is arranged staggeredly or alternately along the array of the pads 2. The solder paste 5 has the same shapes as the openings because the solder paste is filled in the openings as explained later. Then, in FIG. 3B of a sectional view along line 30—30 in FIG. 2, the openings 4a are shown for every other land 2. The openings 4a have oval shapes. As will be explained later, the openings 4a have a width larger than that of the land 2 (refer also to FIG. 2).

Then, solder paste 5 is put on the stencil 4, and it is extended over and filled in the openings 4a while scratched from the stencil 4 by using a squeegee. Thus, the solder paste 5 is filled in the openings 4a of the stencil 4, and the stencil is taken off the board 1. As shown in FIGS. 3B and 2, the solder paste extends over the solder resist layer 3.

As explained above, the solder paste 5 is applied or printed on the lands 2 at alternate portions. Each solder paste 5 is arranged so that a top or bottom end thereof is located at a central position of the land 2 along a longitudinal direction thereof. Thus, the solder paste 5 will be located at a central position of a lead 6 along the longitudinal direction to be put on the land 2. Further, a width $W_M$ of the solder paste 5 printed as mentioned above has a relationship that $$2P-W_L > W_M > W_L,$$

where P denotes the pitch of the lands 2 and $W_L$ denotes a width of the lands 2. That is, the width $W_M$ of the solder paste 5 is larger than the width of the lands 2, and smaller than a distance between the two adjacent lands ($2P - W_L$) so that the solder 5 does not contact with the adjacent lands 2.

Next, an electronics component is put on the printed circuit board 1 so that the leads 6 thereof are positioned on the lands 2, and reflow soldering with the solder paste 5 is performed in a nitrogen ($N_2$) environment. Because the melted solder has good wettability to the lands 2 and the leads 6, the melted solder flows as shown with arrows shown in FIG. 2 onto the entire plane of the lands 2 and the leads 6 and becomes solid even if the solder 5 is applied staggeredly with a width wider than that of the land 2. Thus, all of the pairs of the lands 2 and the leads 6 are adhered over the whole planes thereof with solder 7, as shown in FIG. 3C. Further, because the solder paste 5 is arranged so that a top or bottom end thereof is located at a central position of the land 2 along a longitudinal direction thereof, the solder paste 5 contacts with and adheres to the leads 6 securely even if the positions of the leads 6 are displaced somewhat.

As explained above, the solder paste 5 is printed or applied to the lands staggeredly. Even if the lands 2 have narrow pitches, a width of applied solder 5 is larger than the width of the land 2, so that the solder paste 5 of a necessary amount can be printed surely. Further, though the width of applied solder 5 becomes wider than the width of the land 2, the solder 5 is prevented from flowing below the stencil 4 and filling the area between the lands 2 because the solder resist layer 3 is formed around the lands 2. The reflow of the solder paste 5 in a nitrogen environment suppresses the generation of oxides, and this ensures good wettability.

Therefore, the melted solder readily flows from above the solder resist layer 3 to between the land 2 and the lead 6, and the solder 7 does not cause a short-circuit between two adjacent electrodes 2. To sum up, the solder 7 adheres between the land 2 and the lead 6 over the whole planes thereof, while filets are formed. Thus, reliable adhesion can be provided even for narrow pitches of leads 6 of the integrated circuit 10.

In the embodiment explained above, the solder paste is used, and it is reflowed in a nitrogen environment in order to suppress the reduction of wettability due to production of oxides. On the other hand, solder paste including bismuth or Pb—Sn—Bi alloy solder paste may be used. If the solder paste including bismuth is reflowed, the reduction of wettability due to oxidation can be suppressed even under ambient environment.

In the example shown in FIG. 2, solder paste 5 is applied at one position for each land 2 staggeredly. However, the solder paste may be applied at two or more positions for each land. As shown in FIG. 4, two solder pastes 5' having a circular shape are applied on each land 2. The positions of the two solder pastes 5' are staggered, and one of the two is arranged near an upper or lower end of the land.

On the other hand, the solder paste may have a modified shape other than the shape shown in FIG. 2. For example, as shown in FIG. 5, solder pastes 5" have shapes having a larger curvature at the end of the land 2 and a smaller curvature at the opposite end thereof. Sides of the solder paste near the smaller curvature side are parallel to each other.

Next, a second embodiment of the invention is explained. FIG. 6 shows lands 12 in this embodiment. For the simplicity of explanation, only four lands 12 are shown in FIG. 6 for leads along one side of an integrated circuit among the lands shown in FIG. 1B. Each land 12 comprises a first portion 13 and a second portion 14 which is continuous to the first one 13 and has a narrower width than the first portion 13. Preferably, the first portion has a width about the same as that of the lead 6. The first portions 13 are arranged staggeredly along an array shown in FIG. 6. That is, the first portions 13 are arranged at top and bottom sides alternately in FIG. 6. In this embodiment, no solder resist layer is formed around the lands 12 in contrast to the first embodiment.

When an integrated circuit 10 is mounted, as shown in FIG. 7B which is a section along line 70—70 in FIG. 7A, a stencil 4' is put on the printed circuit board 1, and the solder paste 15 fills in the openings 4a', similarly to FIG. 3B. (Steps in correspondence of FIGS. 3A and 3C are not shown for simplicity of explanation.) In contrast to the first embodiment, the openings 4' have the same shape as the first portion 13. FIG. 7A shows a situation where the stencil 4' is removed. Then, the leads 6 of an electronics component are put on the lands 12, and the solder paste 15 is subjected to reflow soldering in a nitrogen environment. The solder paste 15 flows over the entire land 12, and the leads 6 of the integrated circuit 10 are adhered reliably to the lands 12, similarly to FIG. 3C.

In this embodiment, adhesion can be performed surely for leads having narrow pitches. Further, though a solder resist layer is not formed between the lands 12, no solder paste 15 flows below the stencil 4', and no short circuit occurs between adjacent lands 12.

Solder paste including bismuth may also be used in this embodiment. Then, even if the solder paste is subjected to reflow soldering under ambient environment, the reduction of wettability due to oxidation can be suppressed, without using a nitrogen environment.

In a modified example of the first and second embodiments, solder paste comprising a mixture of Pb/Sn and Sn/Ag powders is used in reflow soldering in a nitrogen environment in order to control the wettability appropriately. The solder paste is effective when a small chip such as a chip of a size of 1 mm * 0.4 mm is mounted on a printed circuit board besides an electronics component having many lead with narrow pitches. If a conventional eutectic Pb—Sn solder paste is used in such a case, the small chip is liable to be soldered at one side thereof because the solder has a definite melting point and the wettability thereof is good. Such a phenomenon can be prevented by using the solder paste comprising a mixture of Pb/Sn and Sn/Ag powders having no definite melting point. Then, the solder melts gradually, and the wettability is not so good as the conventional solder paste. Then, even a small chip can be adhered at both sides thereof surely.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of mounting an electronics component on a board comprising:
   providing a board having lands corresponding to leads of an electronics component, the lands being arranged in parallel to each other;
   forming a solder resist layer between the lands on the board;
   applying solder paste on a portion of each land by using a stencil so that the portion of the applied solder paste is staggered among the lands; and
   placing an electronics component on the board so that leads thereof are positioned on the lands, and performing reflow soldering of the leads to the lands with the solder paste in a nitrogen environment;
   wherein a contour of the solder paste applied on each of the lands has a width wider than that of the land, but narrower than a distance between two of the lands which are positioned adjacent to each other.

2. The method according to claim 1, wherein the number of portions of each of the lands to which the solder paste is applied with the stencil is two.

3. The method according to claim 1, wherein a contour of the solder paste applied with the stencil is oval.

4. The method according to claim 1, wherein a contour of the solder paste applied with the stencil is circular.

5. The method according to claim 1, wherein a contour of the solder paste applied with the stencil comprises a first arc and a second arc having a curvature larger than that of the first arc.

6. The method according to claim 1, wherein the solder paste comprises Pb/Sn and Sn/Ag powders.

7. A method of mounting an electronics component on a board comprising:
   providing a board having lands corresponding to leads of an electronics component, the lands being arranged in parallel to each other;
   forming a solder resist layer between the lands on the board;
   applying solder paste on at least one portion of each land by using a stencil so that the applied solder paste is staggered among the lands, the solder paste having resistance against oxidation; and
   placing an electronics component on the board so that leads thereof are positioned on the lands, and performing reflow soldering of the leads to the lands with the solder paste;
   wherein a contour of the solder paste applied on each of the lands has a width wider than that of the land, but narrower than a distance between two of the lands which are adjacent to each other.

8. The method according to claim 7, wherein the number of portions of each of the lands to which the solder paste is applied with the stencil is two.

9. The method according to claim 7, wherein a contour of the solder paste applied with the stencil is oval.

10. The method according to claim 7, wherein a contour of the solder paste applied with the stencil is circular.

11. The method according to claim 7, wherein a contour of the solder paste applied with the stencil comprises a first arc and a second arc having a curvature larger than that of the first arc.

12. A method of mounting an electronics component on a board comprising:
   providing a board having lands in correspondence to leads of an electronics component, each of the lands comprising a first portion and a second portion having a width narrower than that of the first one, the lands being arranged in parallel to each other so that the first parts are arranged staggeredly;
   applying solder paste on the first portions of the lands by using a stencil; and
   putting an electronics component on the board so that leads thereof are put on the lands and performing reflow soldering of the leads to the lands with the solder paste in a nitrogen environment.

13. The method according to claim 12, wherein the solder paste comprises Pb/Sn and Sn/Ag powders.

14. A method of mounting an electronics component on a board comprising:
   providing a board having lands in correspondence to leads of an electronics component, each of the lands comprising a first portion and a second portion having a width narrower than that of the first one, the lands being arranged in parallel to each other so that the first parts are arranged staggeredly;
   applying solder paste comprising bismuth on the first portions of the lands by using a stencil; and
   putting an electronics component on the board so that leads thereof are put on the lands and performing reflow soldering of the leads to the lands with the solder paste.

* * * * *